(12) United States Patent
Sinha et al.

(10) Patent No.: US 9,741,853 B2
(45) Date of Patent: Aug. 22, 2017

(54) STRESS MEMORIZATION TECHNIQUES FOR TRANSISTOR DEVICES

(71) Applicant: GLOBALFOUNDRIES Inc., Grand Cayman (KY)

(72) Inventors: Mantavya Sinha, Clifton Park, NY (US); Prasanna Kannan, Clifton Park, NY (US); Cuiqin Xu, Malta, NY (US); Tao Wang, Clifton Park, NY (US); Suresh Kumar Regonda, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/926,897

(22) Filed: Oct. 29, 2015

(65) Prior Publication Data
US 2017/0125587 A1    May 4, 2017

(51) Int. Cl.
*H01L 21/00*    (2006.01)
*H01L 29/78*    (2006.01)
(Continued)

(52) U.S. Cl.
CPC ...... *H01L 29/7848* (2013.01); *H01L 21/2253* (2013.01); *H01L 21/283* (2013.01); *H01L 21/324* (2013.01); *H01L 29/66477* (2013.01)

(58) Field of Classification Search
None
See application file for complete search history.

(56) References Cited

U.S. PATENT DOCUMENTS

| 7,670,892 B2 * | 3/2010 | Chakravarthi .... H01L 21/26506 257/E21.051 |
| 8,835,270 B2 | 9/2014 | Nandakumar |

(Continued)

FOREIGN PATENT DOCUMENTS

| CN | 102105965 A | 6/2011 |
| CN | 103855028 A | 6/2014 |

(Continued)

OTHER PUBLICATIONS

U.S. Appl. No. 14/304,017, entitled "Improved Stress Memorization Techniques for Transistor Devices", filed Jun. 13, 2014, not yet published and presently held confidential by the U.S. Patent and Trademark Office.

*Primary Examiner* — Evren Seven
(74) *Attorney, Agent, or Firm* — Heslin Rothenberg Farley & Mesiti P.C.

(57) ABSTRACT

Disclosed are methods for stress memorization techniques and transistor devices prepared by such methods. In one illustrative embodiment, the present disclosure is directed to a method involving fabricating an NMOS transistor device having a substrate and a gate structure disposed over the substrate, the substrate having a channel region underlying, at least partially, the gate structure, the fabricating involving: performing a nitrogen ion implantation process by implanting nitrogen ions into the substrate to thereby form a stress region in the substrate, the stress region separated by the channel region, wherein the stress region has a stress region depth; forming a capping material layer above the NMOS transistor device; and, with the capping material layer in position, performing a stress forming anneal process to thereby form stacking faults in the stress region. In another embodiment, an amorphization ion implantation is per- (Continued)

formed prior to, after or along with the nitrogen ion implantation.

7 Claims, 7 Drawing Sheets

(51) Int. Cl.
  *H01L 29/66* (2006.01)
  *H01L 21/225* (2006.01)
  *H01L 21/283* (2006.01)
  *H01L 21/324* (2006.01)

(56) References Cited

U.S. PATENT DOCUMENTS

| | | | |
|---|---|---|---|
| 9,401,414 B2 | 7/2016 | Wang et al. | |
| 9,414,136 B2 | 8/2016 | Shukla et al. | |
| 2004/0253774 A1* | 12/2004 | Boyanov | H01L 29/1054 438/173 |
| 2004/0253776 A1* | 12/2004 | Hoffmann | H01L 21/28044 438/199 |
| 2005/0093078 A1* | 5/2005 | Chan | H01L 21/823807 257/374 |
| 2006/0240609 A1* | 10/2006 | Orlowski | H01L 21/84 438/197 |
| 2006/0240650 A1* | 10/2006 | Orlowski | H01L 21/823807 438/514 |
| 2007/0072380 A1* | 3/2007 | Wirbeleit | H01L 21/823807 438/303 |
| 2008/0085607 A1* | 4/2008 | Yu | H01L 21/3105 438/758 |
| 2009/0227084 A1* | 9/2009 | Wu | H01L 21/26506 438/301 |
| 2009/0256160 A1* | 10/2009 | Liu | H01L 21/26506 257/77 |
| 2009/0315115 A1* | 12/2009 | Zhang | H01L 21/76224 257/368 |
| 2010/0025743 A1* | 2/2010 | Hoentschel | H01L 21/26506 257/288 |
| 2010/0155898 A1* | 6/2010 | Maynard | H01J 37/3171 257/607 |
| 2010/0193882 A1* | 8/2010 | Hoentschel | H01L 29/165 257/410 |
| 2011/0034014 A1 | 2/2011 | Hatem et al. | |
| 2011/0127588 A1* | 6/2011 | Cheng | H01L 21/26586 257/288 |
| 2012/0184075 A1* | 7/2012 | Domenicucci | H01L 21/26506 438/166 |
| 2013/0277747 A1* | 10/2013 | Liu | H01L 21/26506 257/368 |
| 2014/0110778 A1* | 4/2014 | Fumitake | H01L 29/78 257/330 |
| 2015/0162444 A1* | 6/2015 | Zhao | H01L 29/7842 257/327 |
| 2015/0187941 A1* | 7/2015 | Zhou | H01L 29/1054 257/192 |

FOREIGN PATENT DOCUMENTS

| | | |
|---|---|---|
| TW | 201133567 A | 10/2011 |
| TW | 201539758 A | 10/2015 |
| WO | 2010/014251 A2 | 2/2010 |

* cited by examiner

STRESS MEMORIZATION TECHNIQUES FOR TRANSISTOR DEVICES

FIELD OF THE INVENTION

The present disclosure generally relates to semiconductor devices and to various stress memorization techniques that may be employed when manufacturing transistor devices.

BACKGROUND OF THE INVENTION

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically includes doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Device designers are under constant pressure to increase the operating speed and electrical performance of transistors and integrated circuit products that employ such transistors. Given that the gate length (the distance between the source and drain regions) on current generation transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure, etc. Another technique that device designers have employed to improve device performance is to induce a desired stress in the channel region of a device, i.e., induce a tensile stress in the channel region of an NMOS device (to improve the mobility of charge-carrying electrons) and induce a compressive stress in the channel region of a PMOS device (to improve the mobility of charge-carrying holes). Various stress-memorization techniques are known to those skilled in the art.

One typical prior art process flow that is performed to form NMOS transistors with the desired tensile stress in a CMOS application is as follows. After the gate structures are formed, N-type extension and halo implants are formed for the N-type devices with the P-type devices masked, followed by extension and halo implants on the P-type devices with the N-type devices masked, a spacer is formed on the P-type devices, a cavity is etched in the source/drain regions of the P-type devices and an epi semiconductor material is formed in the cavities on the P-type devices. Next, a so-called SMT (Stress Memorization Technique) processing module is performed on the N-type device. A spacer is formed on the N-type devices and an amorphization implant process is performed using a material such as germanium to amorphize the source/drain region (e.g., using germanium at about 55 keV, $3e^{14}$ ion/cm$^2$ dose). Thereafter, the SMT module involves forming a layer of silicon dioxide (e.g., about 4 nm thick) on the substrate, forming a capping material layer, e.g., a thick layer of silicon nitride (e.g., about 40 nm thick) with the desired intrinsic stress, and heating the device for about 10 minutes at 750° C. in a nitrogen environment. Thereafter, the layer of silicon nitride and the layer of silicon dioxide are removed by performing one or more etching processes. Then, raised source/drain regions are formed on the N-type devices by depositing epi semiconductor material in the source/drain areas of the device. Thereafter, source/drain implant regions are formed by performing an ion implantation process. A heating process is later performed to repair damage to the lattice structure of the substrate due to the amorphization implant process and the other ion implantation processes that were performed on the substrate up to this point in the process flow.

Figure 1A:
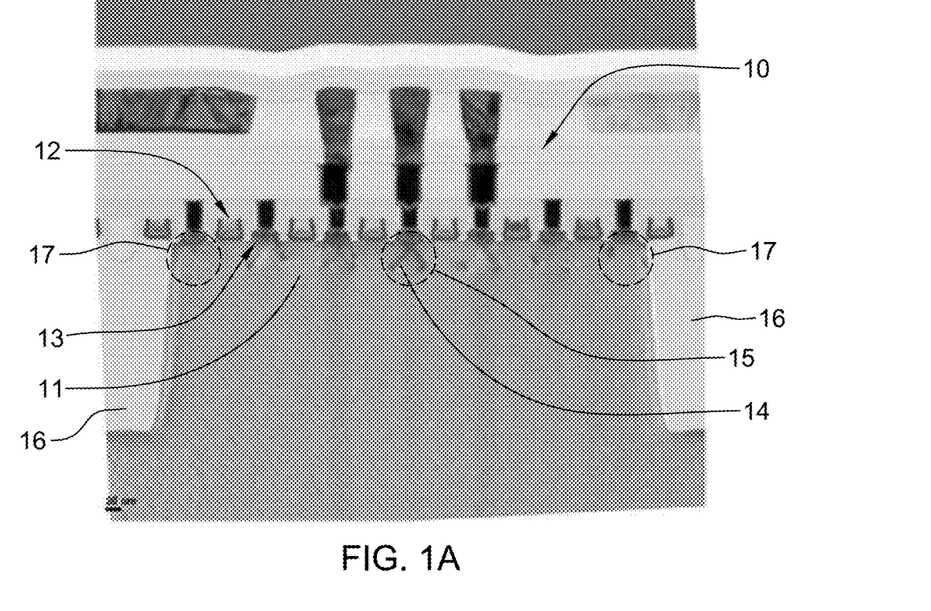
FIG. 1A depicts a TEM photograph of a prior art device wherein stacking faults have been formed in the source/drain regions of some of the transistor devices shown therein.

Prior art stress memorization techniques have a shortcoming of not forming stacking faults when the LOD (Length of Diffusion—the dimension between the edge of the gate structure at issue and the edge of the active region) is small. Thus, the stacking faults often do not form when they have to be located adjacent the free surface of the active region, i.e., the interface between the active region and the isolation material. FIG. 1A is a TEM photograph of an integrated circuit product 10 that includes a plurality of NMOS transistors formed above an active region 11 defined in a semiconductor substrate by an illustrative isolation region 16. As depicted, the transistors include a gate electrode structure 12 and raised source/drain regions 13. Ideally, by performing stress memorization techniques, stacking faults 14 (sometimes referred to as edge dislocations within the industry) will be formed in the active region 11 underneath the raised source/drain areas 13 of the devices. Ideally, for current generation devices with very small gate lengths and very tight gate spacing (pitch), the stacking faults 14 will have an inverted "V" shaped configuration, as depicted in the dashed-line region 15, for a [100] substrate. The stacking faults 14 may have a configuration other than the depicted inverted "V" for devices formed on substrates other than a [100] substrate, i.e., the angle of the downward-pointing "legs" of the inverted "V" shaped stacking faults 14 may be different when the substrate has a different crystallographic orientation. In some applications, the dislocations may not even intersect one another, i.e., the stacking faults may not intersect one another so as to form the "apex" of the inverted "V" shaped stacking faults. Thus, the above reference to the stacking faults 14 having an inverted "V" shaped configuration is only a shorthand reference. However, with respect to the transistors formed adjacent the edge of the isolation region 16 (i.e., when the LOD is small), such stacking faults 14 do not form in the source/drain regions of the device, as reflected by the absence of such stacking faults 14 in the dashed-line regions 17. The lack of the stacking faults 14 indicates that the particular transistor device did not receive any significant benefit from performing the process operations associated with the SMT module, i.e., the source/drain regions of such NMOS devices do not have the desired stacking faults 14. Accordingly, the transistors where the stacking faults 14 are absent, or at least not fully formed, will not perform as well as a transistor device where the stacking faults 14 are present, as depicted in the dashed line region 15 shown in FIG. 1A. This can also lead to across wafer device performance variability. Some attempts have been made to use hydrogen-rich silicon nitride as the stress-inducing material layers and/or fluorine implant for SMT amorphization to improve the formation of the desired stacking faults 14. High junction leakage is another issue that is prevalent with typical prior art SMT processes.

Figure 1B:
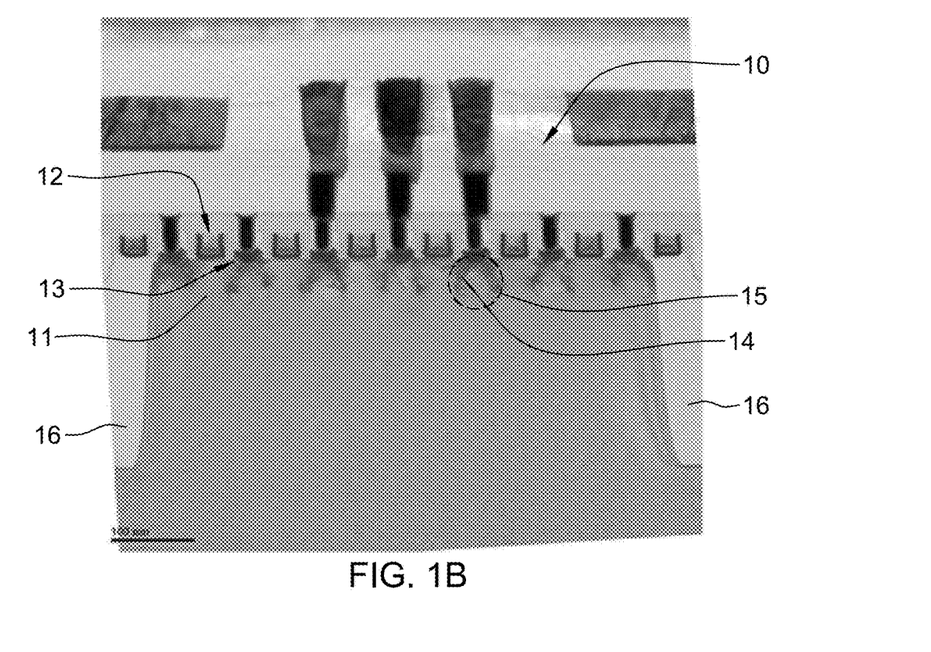
FIG. 1B depicts a TEM photograph of an improved device prepared in accordance with a process disclosed herein.

The present disclosure is directed to various stress memorization techniques that reduce or eliminate one or more of the problems identified above. FIG. 1B depicts TEM photograph of an improved device prepared in accordance with the processes disclosed herein. As could be seen in FIG. 1B, the integrated circuit product 10 has fully formed stacking faults 14. The disclosed stress memorization techniques result in significant reductions in junction leakage and in across-wafer drive current variability as compared to prior art devices.

SUMMARY OF THE INVENTION

The following presents a simplified summary of the disclosure in order to provide a basic understanding of some aspects of the disclosure. This summary is not an exhaustive overview. Its sole purpose is to present some concepts in a simplified form as a prelude to the more detailed description that is discussed later.

Generally, the present disclosure is directed to various stress memorization techniques that may be employed when manufacturing transistor devices. Thus, in one embodiment, the present disclosure is directed to a method which includes:

fabricating an NMOS transistor device which includes a substrate and a gate structure disposed over the substrate, the substrate includes a channel region underlying, at least partially, the gate structure, the fabricating including:
  performing a nitrogen ion implantation process by implanting nitrogen ions into the substrate to thereby form a stress region in the substrate, the stress region separated by the channel region, wherein the stress region has a stress region depth;
  forming a capping material layer above the NMOS transistor device; and
  with the capping material layer in position, performing a stress forming anneal process to thereby form stacking faults in the stress region.

In another embodiment, the present disclosure is directed to a method including: fabricating an NMOS transistor device which includes a substrate and a gate structure disposed over the substrate, the substrate including a channel region underlying, at least partially, the gate structure, the fabricating including:
  performing an amorphization ion implantation process by implanting an amorphization ion material into the substrate to thereby form a stress region in the substrate, the stress region separated by the channel region, wherein the stress region has a stress region depth;
  performing a nitrogen ion implantation process by implanting nitrogen ions into the stress region;
  forming a capping material layer above the NMOS transistor device; and with the capping material layer in position, performing a stress forming anneal process to thereby form stacking faults in the stress region.

In yet another embodiment, the present disclosure is directed to an NMOS transistor device including:
  a substrate;
  a gate structure disposed over the substrate;
  a channel region underlying, at least partially, the gate structure;
  wherein the substrate includes a stress region which includes nitrogen, wherein the stress region is separated by the channel region, wherein the stress region includes at least one stacking fault; and wherein the stress region has a stress region depth; and a source and drain region which includes a source and drain dopant material;
  wherein the source and drain region is located in the stress region, wherein the source and drain region is separated by the channel region; wherein the source and drain region has a source and drain region depth; and wherein the stress region depth is greater than the source and drain region depth.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

DETAILED DESCRIPTION OF THE INVENTION

Certain terms are used throughout the disclosure to refer to particular components. However, different entities may refer to a component by different names. This document does not intend to distinguish between components that differ in name but not function. The terms "including" and "comprising" are used herein in open-ended fashion, and thus mean "including, but not limited to."

The singular forms "a", "an", and "the" include plural referents unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about", is not to be limited to the precise value specified. In some instances, the approximating language may correspond to the precision of an instrument for measuring the value.

The present subject matter will now be described with reference to the attached figures. Various structures, systems, and devices are schematically depicted in the drawings for purposes of explanation only. The attached drawings are included to describe and explain illustrative examples of the present disclosure. The words and phrases used herein should be understood and interpreted to have a meaning consistent with the understanding of those words and phrases by those in the industry. No special definition of a term or phrase, i.e., a definition that is different from the ordinary and customary meaning as understood by those in the industry, is intended to be implied by consistent usage of the term or phrase herein. To the extent that a term or phrase is intended to have a special meaning, such a special definition will be expressly set forth in the specification in a definitional manner that directly and unequivocally provides the special definition for the term or phrase.

The present disclosure is directed to various stress memorization techniques that may be employed when manufacturing transistor devices. As will be readily apparent, the present method is applicable to a variety of devices, including, but not limited to, logic devices, memory devices, etc., and the methods disclosed herein may be employed to form N-type or P-type semiconductor devices. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the devices disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2A:
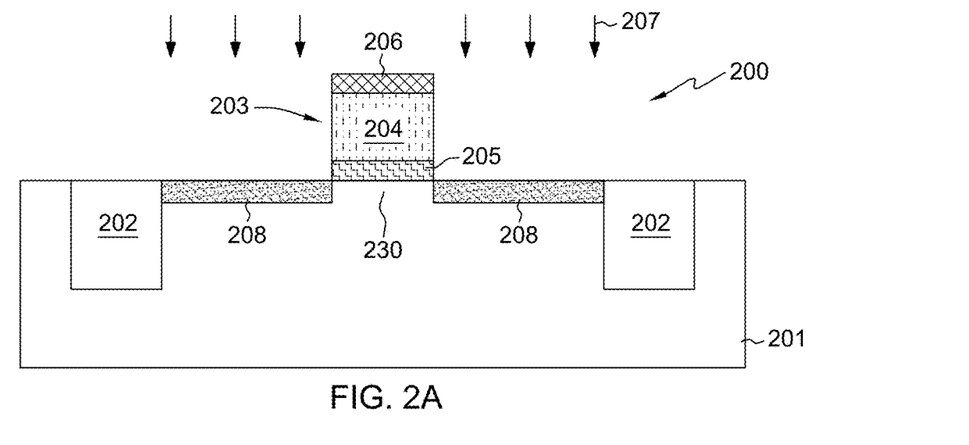
FIGS. 2A-2B depict, in idealized cross-section, various aspects of forming extension implant regions.

FIGS. 2A-7C depict various illustrative embodiments of stress memorization techniques disclosed herein that may be employed when manufacturing transistor devices. FIG. 2A is a simplified view of an illustrative NMOS transistor 200 at an early stage of manufacturing. The transistor 200 is formed in and above an active region of a semiconductor substrate 201 that is defined by an illustrative trench isolation structure 202 formed in the substrate 201. The substrate 201 may have a variety of configurations, such as the depicted bulk silicon configuration. The substrate 201 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 201 may also be made of materials other than silicon.

At the point of fabrication depicted in FIG. 2A, the transistor 200 includes a schematically depicted gate structure 203 that typically includes an illustrative gate insulation layer 205 and an illustrative gate electrode 204. The gate insulation layer 205 may include a variety of different materials, such as, for example, silicon dioxide, a so-called high-k (k greater than 10) insulation material, etc. Similarly, the gate electrode 204 may also be of a material such as polysilicon or amorphous silicon, or it may include one or more metal layers that act as the gate electrode 204. As will be recognized by those skilled in the art after a complete reading of the present application, the gate structure 203 of the transistor 200 depicted in the drawings, i.e., the gate insulation layer 205 and the gate electrode 204, is intended to be representative in nature. That is, the gate structure 203 may include a variety of different materials and it may have a variety of configurations, and the gate structure 203 may be made manufactured using either so-called "gate-first" or "replacement-gate" processing techniques. For ease of explanation, the illustrative transistor 200 will be depicted as having a polysilicon gate electrode 204, however, the present invention should not be considered as limited to such an illustrative embodiment.

With continuing reference to FIG. 2A, also depicted are a gate cap layer 206, e.g., silicon nitride, and so-called extension implant regions 208. The extension implant regions 208 are formed in the substrate 201 by performing an ion implantation process through a photoresist mask (not shown), i.e., by implanting an N-type dopant for the NMOS transistor 200. Although not depicted in the drawings, at the point of fabrication depicted in FIG. 2A, so-called halo implant regions (not shown) have been formed in the substrate 201 typically by performing an angled ion implant process (with a P-type dopant for an NMOS transistor). The various structures and regions of the transistor 200 depicted in FIG. 2A may be formed by performing well-known processes. For example, the gate structure 203 may be formed by depositing various layers of material and thereafter performing one or more etching processes to define the basic layer stack of the gate structure 203 as well as the gate cap layer 206.

Figure 2B:
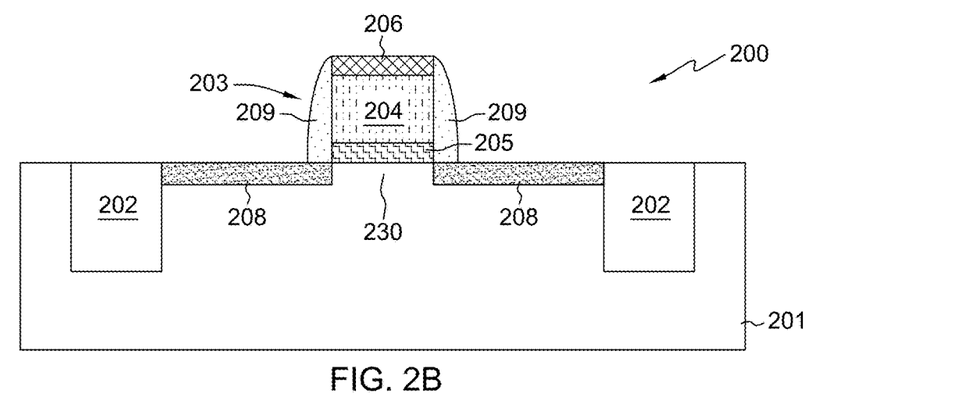

Thus, with reference to FIGS. 2A and 2B, the disclosed methods may include performing an extension ion implantation process 207 by implanting an extension dopant material into the substrate 201 to thereby form a doped extension implant region 208 in the substrate 201, the doped extension implant region 208 separated by the channel region 230; and performing an extension dopant activation anneal process to activate the extension dopant material. The extension dopant material may be selected from a group that includes germanium, carbon, arsenic, phosphorus, and any mixtures thereof. Next, sidewall spacers 209 may be formed adjacent the gate structure 203. The sidewall spacers 209 may be formed by depositing a layer of spacer material, for example, silicon nitride, and thereafter performing an anisotropic etching process on the layer of spacer material so as to result in spacers 209 depicted in FIG. 2B. The base thickness or width of the spacer 209 may vary depending upon the particular application.

Figure 3A:
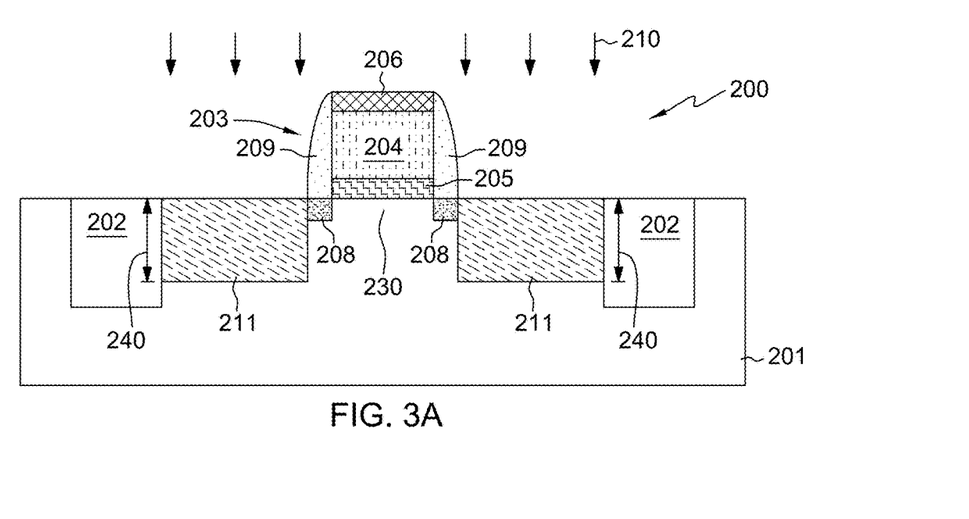
FIGS. 3A-3D and 4A-4E depict, in idealized cross-section, various illustrative embodiments of stress memorization techniques disclosed herein that may be employed when manufacturing transistor devices.
Figure 3B:
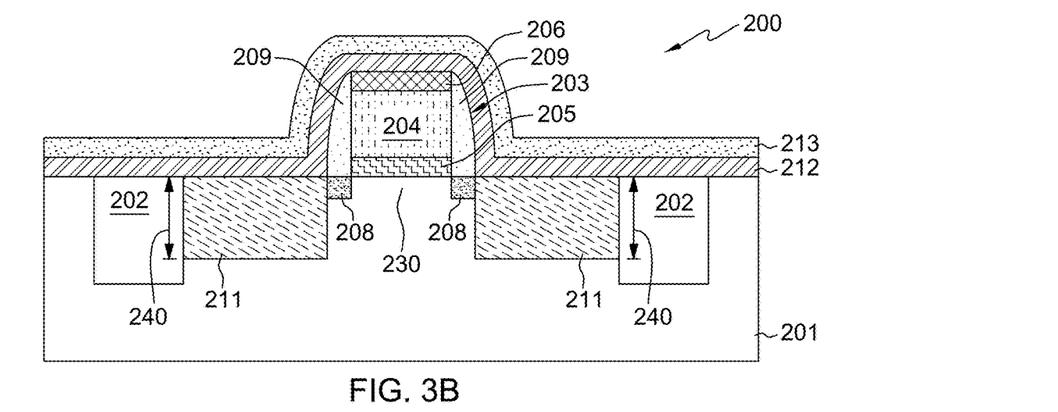
Figure 3C:
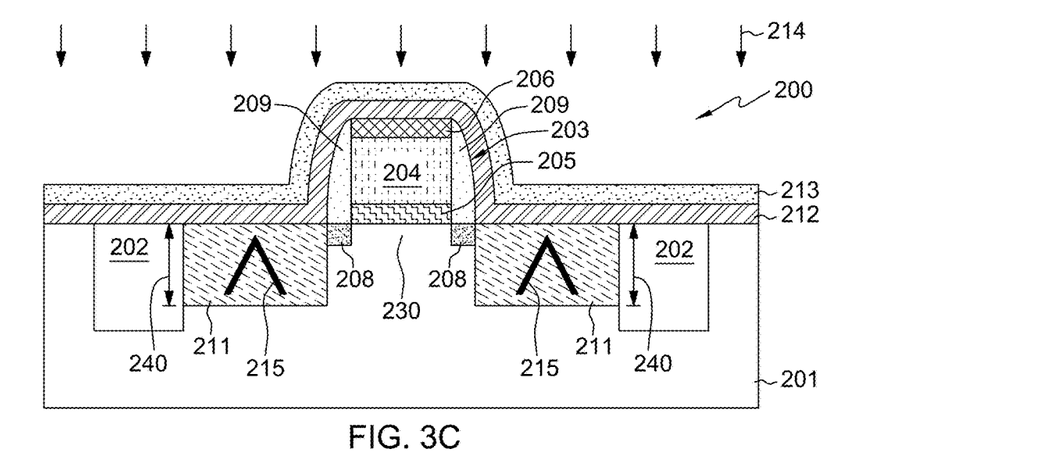

With reference to FIGS. 3A-3D, in one embodiment, the present disclosure is directed to a method including:

fabricating an NMOS transistor device 200 which includes a substrate 201 and a gate structure 203 disposed over the substrate, the substrate including a channel region 230 underlying, at least partially, the gate structure 203, the fabricating including:

performing a nitrogen ion implantation process 210 by implanting nitrogen ions into the substrate 201 to thereby form a stress region 211 in the substrate 201, the stress region 211 separated by the channel region 230, wherein the stress region 211 has a stress region depth 240 (as measured from the surface of the substrate 201), as depicted in FIG. 3A;

forming a capping material layer 213 above the NMOS transistor device 200, as depicted in FIG. 3B; and, with the capping material layer 213 in position, performing a stress forming anneal process 214 to thereby form stacking faults 215 in the stress region 211, as depicted in FIG. 3C.

Figure 3D:
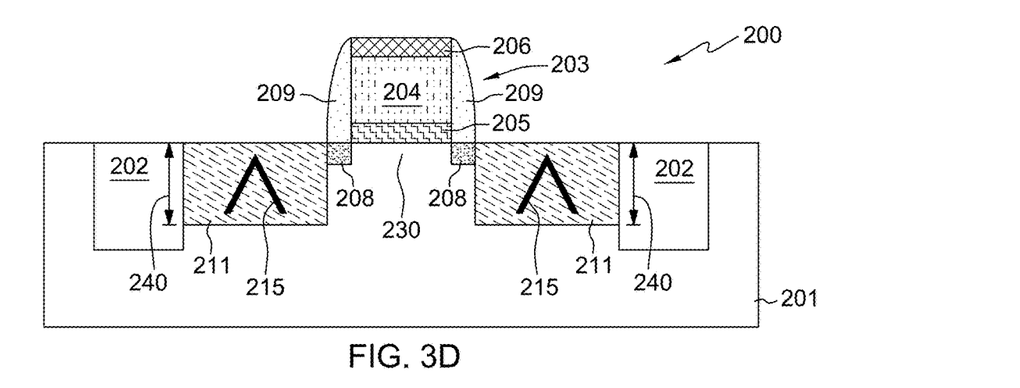

The resulting NMOS transistor device is depicted in FIG. 3D. The implant energy and implant dose of the nitrogen ion implantation process may vary depending upon the application and the selected process flow. For example, the nitrogen ion implantation process 210 may be performed using an implant energy that falls within the range of about 10 keV to about 30 keV and a dose of the nitrogen ion may fall within the range of about $1e^{14}$ ions/cm² to about $1e^{16}$ ions/cm². The nitrogen ion implantation process 210 forms and amorphizes the stress region 211. Therefore, the depth of the nitrogen ion implantation process 210 would be the same as the stress region depth 240. The stress region depth 240 may vary depending upon the particular application. For example, the stress region depth 240 may be from about 30 nm to about 50 nm, as measured from the surface of the substrate 201.

The prior art describes use of nitrogen ions, among other types of ions, as dopants of source and drain regions, as disclosed, for example, in U.S. Pat. No. 8,835,270. However, we disclose for the first time use of nitrogen ion implantation process for improving stress memorization technique. The nitrogen ions implanted in our methods do not create source and drain region and are implanted to a greater depth than the depth of the source and drain region. Thus, in our methods, nitrogen ions are implanted with the end goal of creating stacking faults in the stress region. Advantageously, our methods lead to improved properties of the resulting transistor device, such as more consistent formation of stacking faults and significant reductions in junction leakage and across-wafer drive current variability as compared to prior art devices.

Prior to performing the nitrogen ion implantation process 210, the method may further include performing an extension ion implantation process 207 as described above with reference to FIGS. 2A and 2B.

Figure 4A:
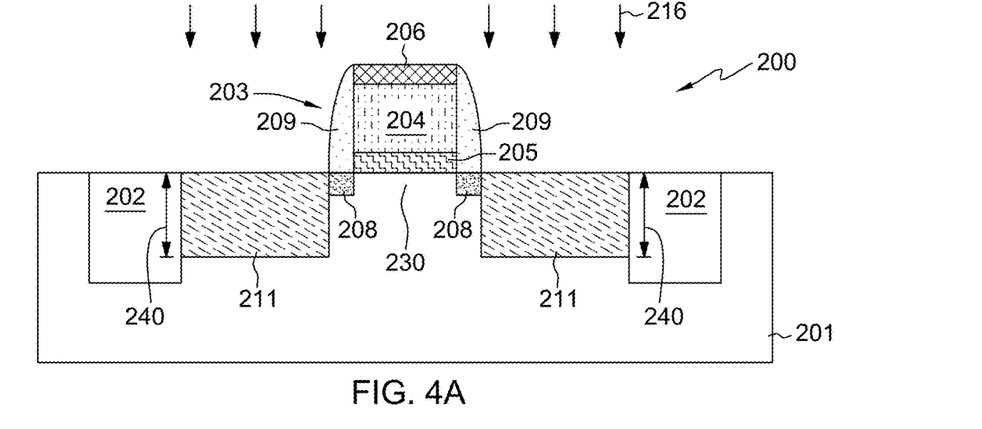
Figure 4B:
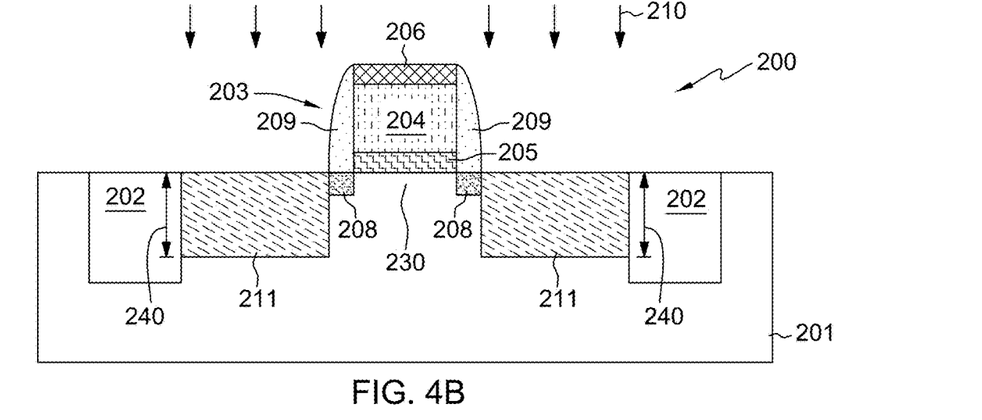
Figure 4C:
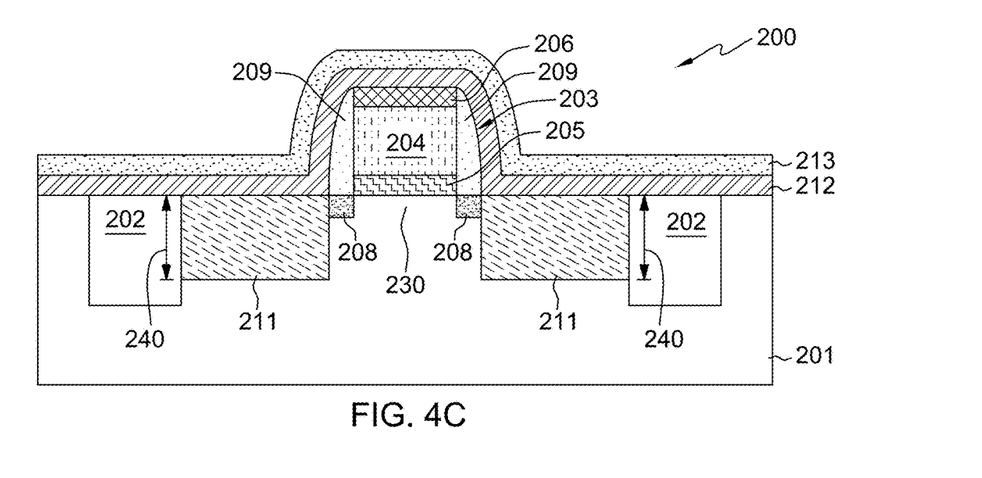
Figure 4D:
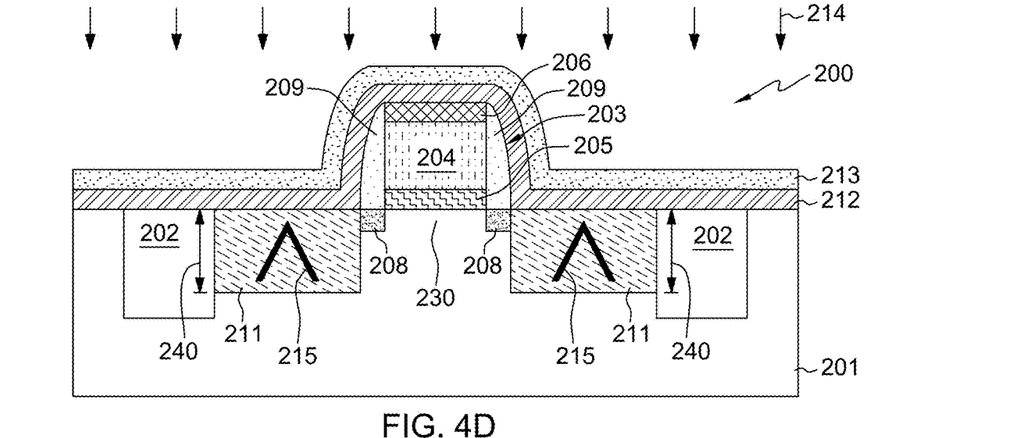

In another embodiment, with reference to FIGS. 4A-4E, the disclosed method includes:
  fabricating an NMOS transistor device 200 which includes a substrate 201 and a gate structure 203 disposed over the substrate 201, the substrate 201 including a channel region 230 underlying, at least partially, the gate structure 203, the fabricating including:
    performing an amorphization ion implantation process 216 by implanting an amorphization ion material into the substrate 201 to thereby form a stress region 211 in the substrate 201, the stress region 211 separated by the channel region 230, wherein the stress region 211 has a stress region depth 240, as depicted in FIG. 4A;
    performing a nitrogen ion implantation process 210 by implanting nitrogen ions into the stress region 211, as depicted in FIG. 4B; forming a capping material layer 213 above the NMOS transistor device 200, as depicted in FIG. 4C; and
    with the capping material layer 213 in position, performing a stress forming anneal process 214 to thereby form stacking faults 215 in the stress region 211, as depicted in FIG. 4D.

Figure 4E:
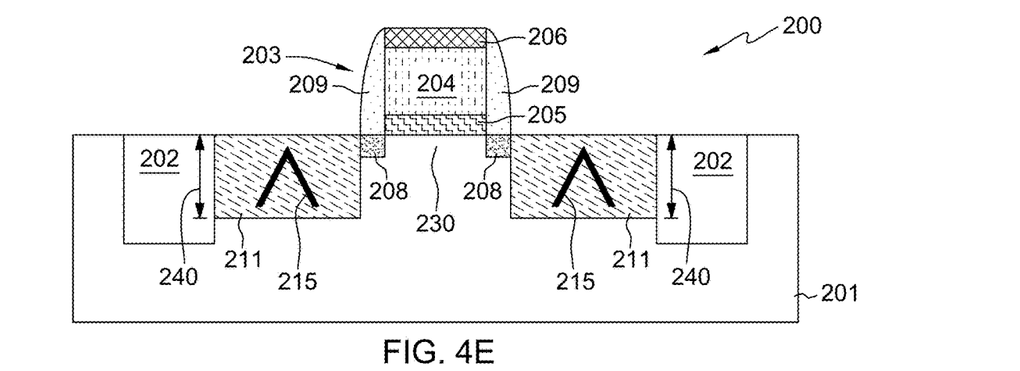

The resulting NMOS transistor device is depicted in FIG. 4E. The amorphization ion material may be selected from a group which includes germanium, silicon, and any mixtures thereof. The implant energy and implant dose of the amorphization ion implantation process 216 may vary depending upon the application and the selected process flow. The amorphization ion implantation process 216 may be performed using an implant energy that falls within the range of about 10 keV to about 100 keV and an implant dose may fall within the range of about $1e^{14}$ ions/cm² to about $1e^{16}$ ions/cm². In this embodiment, the amorphization ion implantation process 216 forms and amorphizes the stress region 211. Therefore, the depth of the amorphization ion implantation process 216 would be the same as the stress region depth 240. As discussed above, the stress region depth 240 may vary depending upon the particular application. For example, the stress region depth 240 may be from about 30 nm to about 50 nm, as measured from the surface of the substrate 201.

As discussed above, the implant energy and implant dose of the nitrogen ion implantation process 210 may vary depending upon the application and the selected process flow. The nitrogen ion implantation process 210 may be performed using an implant energy that falls within the range of about 10 keV to about 30 keV and a dose of the nitrogen ion may fall within the range of about $1e^{14}$ ions/cm² to about $1e^{16}$ ions/cm². The depth of the nitrogen ion implantation process 210 may be the same as the depth of the amorphization ion implantation process 216.

Prior to performing the amorphization ion implantation process 216, the method may further include performing an extension ion implantation process 207 as described above with reference to FIGS. 2A and 2B.

In another embodiment, the amorphization ion implantation process is performed after the nitrogen ion implantation process. Additionally, in another embodiment, the amorphization ion implantation process and the nitrogen ion implantation process are performed simultaneously.

The stress region is formed by the amorphization ion implantation process, the nitrogen ion implantation process, or by both the amorphization ion implantation process and the nitrogen ion implantation process when these two processes are performed simultaneously. Thus, the stress region is formed by the amorphization ion implantation process if the amorphization ion implantation process is performed prior to the nitrogen ion implantation process. The stress region is formed by the nitrogen ion implantation process if the nitrogen ion implantation process is performed prior to the amorphization ion implantation process. The stress region is formed by both the amorphization ion implantation process and the nitrogen ion implantation process if the amorphization ion implantation process and the nitrogen ion implantation process are performed simultaneously.

In any of the described embodiments, the gate structure 203 may include a high-k gate insulation layer and a gate electrode, wherein the gate electrode includes at least one layer of metal. In another embodiment, the gate structure may include a silicon dioxide gate insulation layer and a gate electrode, wherein the gate electrode includes a layer of polysilicon.

When forming a capping material layer 213 above the NMOS transistor device 200 in any of the described embodiments, a thin (about 2-4 nm) liner layer 212 may be conformably deposited on the device 200 by performing a CVD or an ALD process. The liner layer 212 may be composed of silicon dioxide. Thereafter, the capping material layer 213 may be formed above the transistor 200. The capping material layer 213 may include a material such as silicon nitride and it may have a thickness of about 20-80 nm. The capping material layer 213 may be formed with or without any intrinsic stress.

Accordingly, in any of the described embodiments, the capping material layer 213 may include silicon nitride. In another embodiment, the capping material layer 213 may include a layer of silicon nitride deposited over a layer of silicon oxide.

In any of the described embodiments, the stress forming anneal process 214 may be performed in an inert ambient (e.g., $N_2$) at a temperature that falls within the range of from about 600° C. to about 800° C. The duration of such stress forming anneal process 214 may be about 10 minutes. In another embodiment, the stress forming anneal process 214 may be a rapid thermal spike anneal process performed in an inert ambient at a temperature that falls within the range of from about 950° C. to about 1050° C.

As shown in FIGS. 3C and 4D, the stress forming anneal process 214 results in formation of schematically depicted stacking faults 215. As shown in FIG. 1B, fully formed stacking faults 14 can be seen in the TEM photograph of an improved device prepared in accordance with the processes disclosed herein. Such fully formed stacking faults 14 were not created using traditional manufacturing processes on a similarly sized device, as can be seen in FIG. 1A.

FIG. 1B is a TEM of a device fabricated using the methods disclosed herein wherein the nitrogen ion implantation process 210 was performed after the amorphization ion implantation process 216. As depicted, contrary to prior art processing techniques, the device exhibited well-formed stacking faults 14. Without seeking to limit the inventions disclosed herein, it is believed that the introduction of the nitrogen ion into the substrate lowers the formation energy for such stacking faults 14. Thus, for devices with small LOD dimensions, the stacking faults 14 still form even though they are located adjacent the free surface of the active region, i.e., the interface between the active region and the isolation material. Of course, for devices with longer LODs that are located remote from the edge of the active region, the desired stacking faults 14 will still form. Thus, using the methods described herein, the device in FIG. 1B exhibited better relative electrical performance over the prior art device shown in FIG. 1A. More specifically, the disclosed stress memorization techniques result in up to six fold reduction in junction leakage over prior art devices. The disclosed stress memorization techniques also result in significant reduction in across-wafer drive current variability as compared to the prior art devices.

FIGS. 3D and 4E depict the device 200 after the capping material layer 213 and the liner layer 212 were sequentially removed from the device 200 by performing one or more etching processes.

Figure 5:
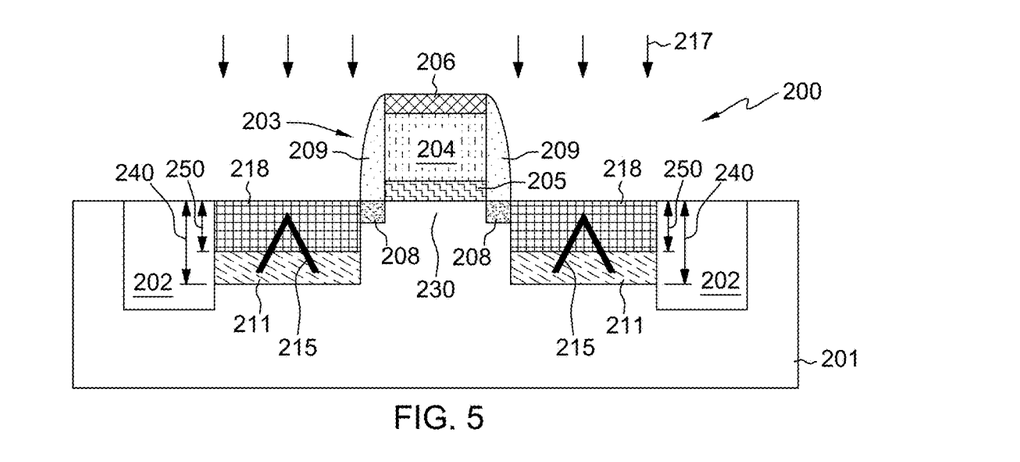
FIGS. 5, 6A-6B, and 7A-7C depict, in idealized cross-section, various illustrative embodiments of source and drain region forming methods.

Any of the described embodiments may further include the steps of removing the capping material layer 213; and forming a source and drain region, such as the source and drain region 218 of FIG. 5, wherein the source and drain region is separated by the channel region 230, wherein the source and drain region has a source and drain region depth 250, and wherein the stress region depth 240 is greater than the source and drain region depth 250. The step of forming the source and drain region may be performed by any process known in the art. The source and drain region depth 250 may vary depending on the application. For example the source and drain region depth 250 may be about 20 to 30 nm, as measured from the surface of the substrate.

With reference to FIG. 5, the source and drain region may be formed by performing a source and drain ion implantation process 217 by implanting a source and drain dopant material into the stress region 211 to thereby form the source and drain region 218; and performing a source and drain activation anneal process to activate the source and drain dopant material. The source and drain dopant material may be selected from a group which includes germanium, carbon, arsenic, phosphorus, and any mixtures thereof.

The source and drain activation anneal process is performed to repair any damage to the crystalline structure of the substrate 201 and to activate the implanted dopant materials. This source and drain activation anneal process repairs the source and drain regions amorphized with the source and drain ion implantation process, i.e., they are restored to the original crystalline structure of the substrate.

Figure 6A:
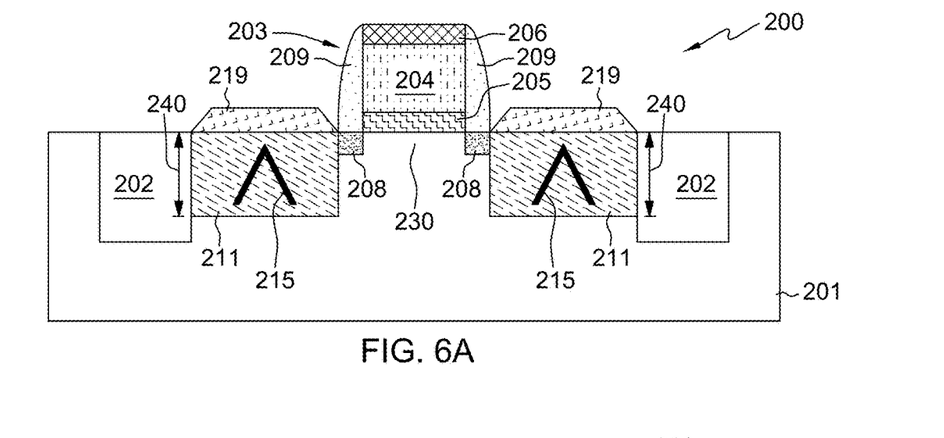
Figure 6B:
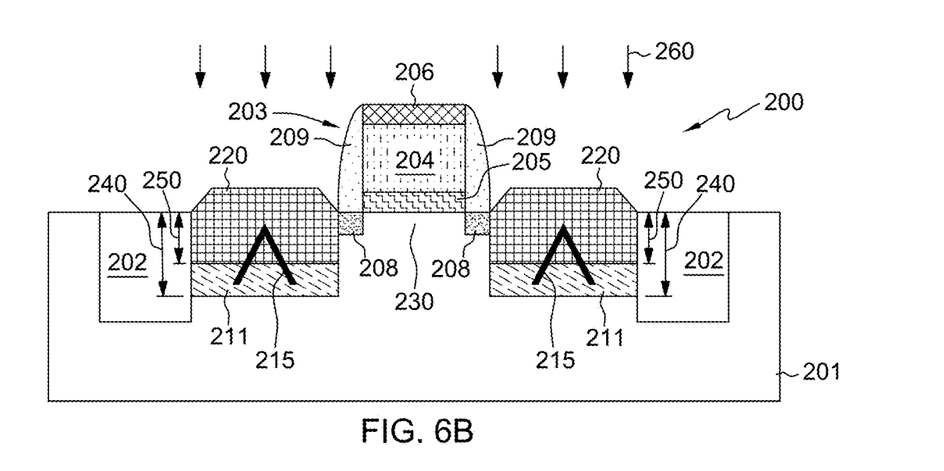

With reference to FIGS. 6A and 6B, the source and drain region may be formed by an epitaxial deposition process, for example, by epitaxially growing an additional semiconductor material 219 on the stress region 211, as depicted in FIG. 6A. The additional semiconductor material 219 will constitute an upper portion of the final raised source and drain region 220. The additional semiconductor material 219 may include a variety of different materials, for example, silicon, silicon carbon, silicon phosphorus, silicon carbon phosphorus, and other suitable materials. This method would then involve performing a source and drain ion implantation process 260 by implanting a source and drain dopant material into the additional semiconductor material 219 and into the stress region 211 to thereby form a raised source and drain region 220, as depicted in FIG. 6B; and performing a source and drain activation anneal process to activate the source and drain dopant material. The source and drain dopant material may be selected from a group which includes germanium, carbon, arsenic, phosphorus, and any mixtures thereof.

Figure 7A:
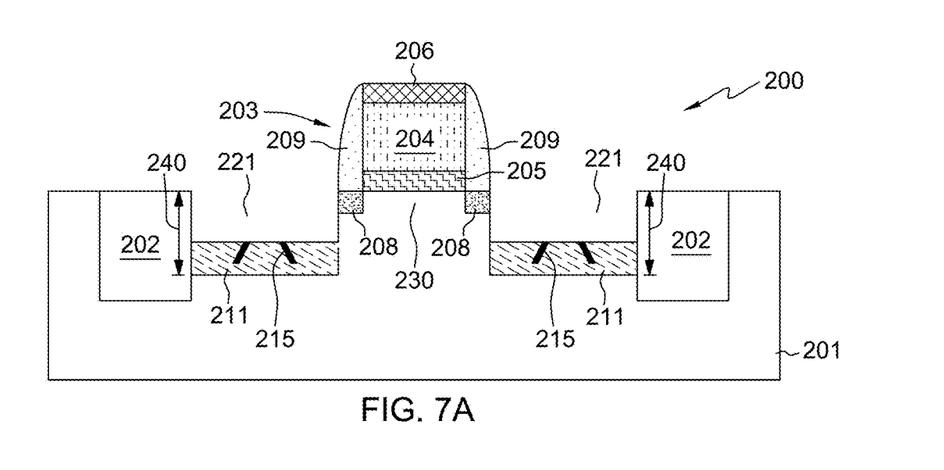
Figure 7B:
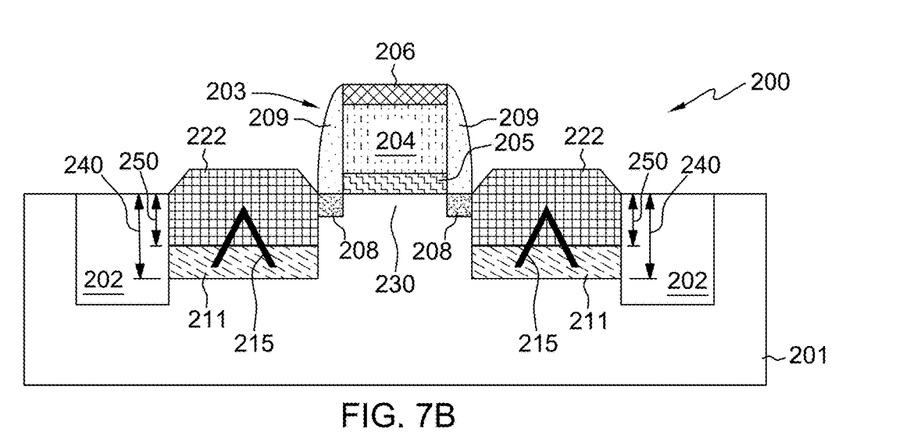
Figure 7C:
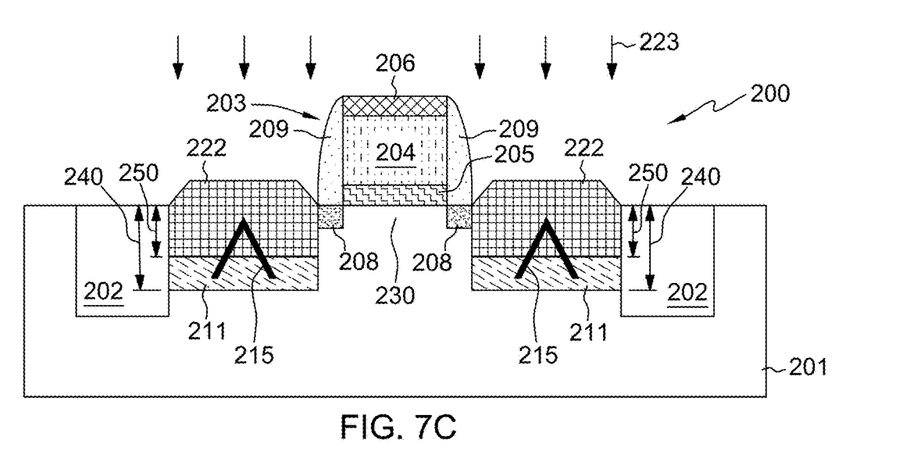

Alternatively, with reference to FIGS. 7A-7C, the source and drain region may be formed by forming a source and drain cavity 221 in the substrate 201, wherein the source and drain cavity 221 is separated by the channel region 230, as depicted in FIG. 7A; epitaxially growing the source and drain region 222 within the source and drain cavity 221, as depicted in FIG. 7B; performing a source and drain ion implantation process 223 by implanting a source and drain dopant material into the source and drain region 222, as depicted in FIG. 7C; and performing a source and drain activation anneal process to activate the source and drain dopant material. In this process, the source and drain dopant material may be selected from a group which includes germanium, carbon, arsenic, phosphorus, and any mixtures thereof.

In another embodiment, the source and drain region may be formed by forming a source and drain cavity in the substrate (similar to the source and drain cavity 221 shown in FIG. 7A), wherein the source and drain cavity is separated by the channel region; and, with an in situ doped semiconductor material, epitaxially growing the source and drain region within the source and drain cavity. In this embodiment, the in situ doped semiconductor material may be doped with phosphorus.

Other known methods for forming of the source and drain region may be employed and are within the scope of the methods described herein.

With respect to all of the described embodiments, after formation of the source and drain region, additional processing operations may be performed to incorporate the device into an integrated circuit, e.g., the formation of source/drain contacts, the formation of a gate contact, and the formation of various metallization layers above the device 200.

The described methods result in improved transistor devices. Accordingly, in one embodiment, the present disclosure is directed to an NMOS transistor device, which includes:

a substrate;

a gate structure disposed over the substrate;

a channel region underlying, at least partially, the gate structure;

wherein the substrate includes a stress region which includes nitrogen, wherein the stress region is separated by the channel region, wherein the stress region includes at least one stacking fault; and wherein the stress region has a stress region depth; and a source and drain region including a source and drain dopant material; wherein the source and drain region is located in the stress region, wherein the source and drain region is separated by the channel region; wherein the source and drain region has a source and drain region depth; and wherein the stress region depth is greater than the source and drain region depth.

For example, with reference to FIG. 5, the NMOS transistor device 200 may include:

a substrate 201;

a gate structure 203 disposed over the substrate 201;

a channel region 230 underlying, at least partially, the gate structure 203;

wherein the substrate 201 includes a stress region 211 which includes nitrogen, wherein the stress region is separated by the channel region 230, wherein the stress region 211 includes at least one stacking fault 215; and wherein the stress region 211 has a stress region depth 240; and a source and drain region 218 which includes a source and drain dopant material;

wherein the source and drain region 218 is located in the stress region 211, wherein the source and drain region 218 is separated by the channel region 230;

wherein the source and drain region 218 has a source and drain region depth 250;

and wherein the stress region depth 240 is greater than the source and drain region depth 250.

In one embodiment, the stress region of the NMOS transistor device further includes germanium.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method comprising:
    fabricating an NMOS transistor device comprising a substrate and a gate structure disposed over the substrate, the substrate comprising a channel region underlying, at least partially, the gate structure, the fabricating comprising:
        forming a stress region by performing an ion implantation process consisting of implanting nitrogen ions into the substrate to form the stress region in the substrate, the stress region separated by the channel region, wherein the stress region has a stress region depth;
        forming a capping material layer above the NMOS transistor device; and
        with the capping material layer in position, forming stacking faults in the stress region by performing a stress forming anneal process.

2. The method of claim 1, further comprising:
    prior to performing the nitrogen ion implantation process, performing an extension ion implantation process by implanting an extension dopant material into the substrate to thereby form a doped extension implant region in the substrate, the doped extension implant region separated by the channel region; and
    performing an extension dopant activation anneal process to activate the extension dopant material.

3. The method of claim 1, further comprising:
    removing the capping material layer; and
    forming a source and drain region, wherein the source and drain region is separated by the channel region, wherein the source and drain region has a source and drain region depth, and wherein the stress region depth is greater than the source and drain region depth.

4. The method of claim 3 wherein forming the source and drain region comprises:
    performing a source and drain ion implantation process by implanting a source and drain dopant material into the stress region to thereby form the source and drain region; and
    performing a source and drain activation anneal process to activate the source and drain dopant material.

5. The method of claim 3, wherein forming the source and drain region comprises:
    epitaxially growing an additional semiconductor material on the stress region;
    performing a source and drain ion implantation process by implanting a source and drain dopant material into the additional semiconductor material and into the stress region; and
    performing a source and drain activation anneal process to activate the source and drain dopant material.

6. The method of claim 3, wherein forming the source and drain region comprises:
    forming a source and drain cavity in the substrate, wherein the source and drain cavity is separated by the channel region;
    epitaxially growing source and drain region within the source and drain cavity;
    performing a source and drain ion implantation process by implanting a source and drain dopant material into the source and drain region; and
    performing a source and drain activation anneal process to activate the source and drain dopant material.

7. The method of claim 3, wherein forming the source and drain region comprises:
    forming a source and drain cavity in the substrate, wherein the source and drain cavity is separated by the channel region; and
    with an in situ doped semiconductor material, epitaxially growing the source and drain region within the source and drain cavity.

* * * * *